United States Patent
Sun

(10) Patent No.: US 9,759,406 B2
(45) Date of Patent: Sep. 12, 2017

(54) OPTICAL PATH ADJUSTING UNIT AND DISPLAY DEVICE

(71) Applicant: BOE TECHNOLOGY GROUP CO., LTD., Beijing (CN)

(72) Inventor: Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 14/894,883

(22) PCT Filed: Jun. 18, 2015

(86) PCT No.: PCT/CN2015/081731
§ 371 (c)(1),
(2) Date: Nov. 30, 2015

(87) PCT Pub. No.: WO2016/110058
PCT Pub. Date: Jul. 14, 2016

(65) Prior Publication Data
US 2016/0363291 A1    Dec. 15, 2016

(30) Foreign Application Priority Data

Jan. 6, 2015 (CN) .......................... 2015 1 0005753

(51) Int. Cl.
*F21V 13/14* (2006.01)
*G02B 3/08* (2006.01)
(Continued)

(52) U.S. Cl.
CPC ................ *F21V 13/14* (2013.01); *G02B 3/08* (2013.01); *G02B 5/0278* (2013.01);
(Continued)

(58) Field of Classification Search
CPC .......... F21V 13/14; G02B 3/08; G02B 5/0278; G02B 5/0294; G02B 5/09; G02B 17/086; G02B 19/0023; G02B 19/0047
See application file for complete search history.

(56) References Cited

U.S. PATENT DOCUMENTS

| 5,334,995 A | 8/1994 | Iino |
| 5,400,178 A | 3/1995 | Yamada et al. |
| 5,768,025 A | 6/1998 | Togino et al. |

FOREIGN PATENT DOCUMENTS

| CN | 201402568 | 2/2010 |
| CN | 102087814 | 6/2011 |

(Continued)

OTHER PUBLICATIONS

International Search Report from PCT Application No. PCT/CN2015/081731, Sep. 23, 2015, 5 pages.

(Continued)

*Primary Examiner* — Mary Ellen Bowman
(74) *Attorney, Agent, or Firm* — Harness, Dickey & Pierce, P.L.C.

(57) ABSTRACT

The invention provides an optical path adjusting unit and a display device. The optical path adjusting unit, for adjusting light rays from different directions to transmit in approximately the same direction, comprises a light converging part, a reflective part and a light scattering part. The light converging part and the light scattering part form a hollow space, and the reflective part is disposed within the hollow space and connected to the middle of the light converging part and the middle of the light scattering part to divide the hollow space into two parts. The light converging part is used to converge the light rays from different directions; the reflective part is used to reflect the converged light rays onto the light scattering part, and the light scattering part is used (Continued)

to transmit the light rays reflected thereon by the reflective part out in approximately the same direction.

20 Claims, 4 Drawing Sheets

(51) Int. Cl.
    *G02B 5/02*     (2006.01)
    *G02B 5/09*     (2006.01)
    *G02B 17/08*     (2006.01)
    *G02B 19/00*     (2006.01)

(52) U.S. Cl.
    CPC .............. *G02B 5/0294* (2013.01); *G02B 5/09* (2013.01); *G02B 17/086* (2013.01); *G02B 19/0023* (2013.01); *G02B 19/0047* (2013.01)

(56) References Cited

FOREIGN PATENT DOCUMENTS

| | | |
|---|---|---|
| CN | 102207567 | 10/2011 |
| CN | 103903519 | 7/2014 |
| CN | 203689856 | 7/2014 |
| CN | 103969736 | 8/2014 |
| CN | 104035233 | 9/2014 |
| CN | 104614855 | 5/2015 |
| CN | 204360012 | 5/2015 |
| JP | 2011172083 | 9/2011 |

OTHER PUBLICATIONS

Written Opinion of the International Searching Authority from PCT Application No. PCT/CN2015/081731, Sep. 23, 2015, 5 pages.
First Chinese Office action from Chinese Application No. 20150005753.6, Jul. 28, 2016, 7 pages.

US 9,759,406 B2

OPTICAL PATH ADJUSTING UNIT AND DISPLAY DEVICE

CROSS-REFERENCES TO RELATED APPLICATIONS

This patent application claims priority of Chinese Patent Application No. 201510005753.6, filed on Jan. 6, 2014, the entire content of which is incorporated by reference herein.

FIELD OF THE INVENTION

The present invention belongs to the technical field of display, more particularly, to an optical path adjusting unit and a display device.

BACKGROUND

Flat panel display technology develops rapidly in the recent decade. It has become current mainstream display technology, since both the screen size and the display quality get prominent progress. Currently, flat panel display device mainly includes Liquid Crystal Display (LCD) and Organic Light Emission Display (OLED). With the development of the Active Matrix Organic Light Emission Display (AMO-LED), the application field of the flexible display screen becomes wider and wider, and the size becomes larger and larger. Moreover, for the displays with larger size, they are usually formed by splicing many small-sized display screens. However, the splicing region of the large-sized display screen formed by way of the splicing will unavoidably have black strips, which may cause the display image discontinuity, and severely affect the display effect of the large-sized display screen.

Therefore, it becomes an urgent technical problem to be solved to design a display device with good splicing effect and continuous display images.

BRIEF SUMMARY OF THE DISCLOSURE

The technical problem to be solved by the present invention is, for the above deficiency in the prior art, to provide an optical path adjusting unit and a display device. According to the invention, the light incident from different directions can be adjusted by the optical path adjusting unit to transmit in approximately the same direction, and the display panel of the display device using the optical path adjusting unit has a good splicing effect, while the displayed images are continuous and the visual effects are better.

In order to solve the technical problem of the present invention, according to an aspect of the present invention, there is provided an optical path adjusting unit for adjusting the light rays incident from different direction to transmit in approximately the same direction, and it comprises a light converging part, a reflecting part, and a light scattering part. The light converging part and the light scattering part form a hollow space, and the reflecting part is disposed within the hollow space and is connected to the middle of the light converging part and the light scattering part respectively, to divide the hollow space into two parts, wherein the light converging part is used to converge light rays incident thereon from different directions, the reflective part is used to reflect the light rays converged by the light converging part onto the light scattering part, and the light scattering part is used to transmit the light rays reflected thereon by the reflective part out in approximately the same direction.

In one embodiment, the light converging part comprises two arc structures disposed symmetrically, and the light scattering part is a symmetric arc structure; the light converging part and the light scattering part form a symmetric hollow space; the reflective part is arranged in a symmetric plane of a symmetric hollow space, and the light rays reflected onto the light scattering part are transmitted out in a direction approximately parallel to the direction of the symmetric plane of the hollow space.

In one embodiment, the light converging part comprises two arc light converging sheets with the same shape and size, and disposed in the form of mirror symmetry; wherein the two light converging sheets are connected to each other at one end, and the other ends are connected to the two ends of the light scattering part respectively; the reflective part is disposed in the mirror symmetric plane of the two light converging sheets, one end of which is connected to the two ends of the light converging sheets connected to each other, and the other end is connected to the middle of the light scattering part, which is located in the symmetric plane of the light scattering part.

In one embodiment, each of the light converging sheets is a convex lens structure, and a radian of the arc surface of the light converging sheet close to the hollow space is greater than that of the arc surface far away from the hollow space.

In one embodiment, the light scattering part is a concave lens structure.

In one embodiment, the reflective part is a symmetric wedge-shaped structure, and the larger end of the symmetric wedge-shaped structure is connected to the ends of the two light converging sheets connected to each other, and the smaller end is connected to the middle of the light scattering part, which is located in the symmetric plane of the light scattering part; and the two side surfaces of the symmetric wedge-shaped structure facing the two light converging sheets are disposed with reflective films.

In one embodiment, the angle of the symmetric wedge-shaped structure is in the range of 3° to 7°.

In one embodiment, the light converging part, the reflective part and the light scattering part are formed integrally;

or, the light converging part, the light scattering part and the reflective part are formed respectively, and then are assembled together;

or, the light converging part and the light scattering part are formed integrally, and the reflective part is formed independently, and then the reflective part formed independently and the light converging part and the light scattering part formed integrally are assembled together.

In one embodiment, the light converging part, the reflective part and the light scattering part are formed by using colorless and transparent materials.

In one embodiment, the light converging part, the reflective part and the light scattering part are formed by using glass materials or resin materials.

In order to solve the technical problem of the present invention, according to another aspect of the present invention, there is provided a display device, comprising at least two display screens which can be spliced together, there being a splicing gap between the adjacent display screens, wherein any one of the above optical path adjusting units is disposed within the splicing gap.

In one embodiment, the edge part of the at least two display screen bends inwards to form a bended part, and the splicing gap is formed between the bended parts of the adjacent display screens. The optical adjusting path is disposed within the splicing gap, and the lengths of the light converging part, the reflective part and the light scattering part are the same as that of the splicing gap of the display screen.

In one embodiment, the bended part of the display screen comprises a plane part and a curve surface part, wherein a radian of the curve surface part is consistent with a radian of the arc surface of the light converging sheet, in the light converging part, far away from the hollow space. The curve surface part comprises a black matrix and a light emitting unit, and the light rays emitted from the light emitting unit enter into the light converging part in different directions and are transmitted out of the light scattering part in a direction approximately parallel to the direction of the plane part.

The advantageous effect of the present invention is: the optical path adjusting unit may adjust light rays incident from different directions to transmit in approximately the same direction, and it has a simple structure and is easy to be manufactured.

Correspondingly, the display device using the optical path adjusting unit implements a frameless and large-sized flexible display screen structure formed by way of splicing, such that the display panel of the display device has good splicing effect, while the display images are continuous and the visual effect is better.

DETAILED DESCRIPTION

In order to make those skilled in the art better understand the technical solutions of the present invention, the optical path adjusting unit and the display device provided by the present invention will be described in further detail by combining with the accompanying drawings and the specific embodiments.

Embodiment 1:

This embodiment provides an optical path adjusting unit for adjusting the light incident from different directions to transmit in approximately the same direction.

Figure 1:
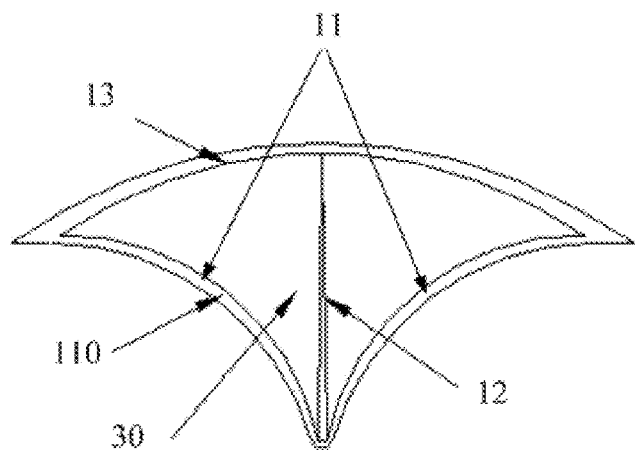
FIG. 1 is a schematic view of the structure of the optical path adjusting unit provided by embodiment 1 of the present invention.

As shown in FIG. 1, the optical path adjusting unit comprises a light converging part 11, a reflective part 12 and a light scattering part 13. The light converging part 11 and the light scattering part 13 are connected together to form a hollow space, and the reflective part 12 is disposed in the hollow space and connected to the middle of the light converging part 11 and the middle of the light scattering part 13 respectively, to divide the hollow space into two parts.

The light converging part 11 is used for converging the light rays incident thereon in different directions, the reflective part 12 is used for reflecting the light rays converged by the light converging part 11 to the light scattering part 13, and the light scattering part 13 is used for scattering the light rays reflected by the light reflecting part 12 to make them transmit in approximately the same direction, for example, a direction approximately parallel to the front-facing direction. Since the light converging part 11 and the light scattering part 13 form a hollow space, and the reflective part 12 is connected to the middle of the light converging part 11 and the middle of the light scattering part 13 respectively to divide the hollow space into two parts, it may realize the effect of adjusting the light rays incident from different directions to make them transmit in approximately the same direction by the cooperation of the shapes and sizes of the light converging part 11, the light reflecting part 12 and the light scattering part 13.

It should be understood that here the "front-facing" is relative "front-facing"which is defined relative to the visual direction of human eyes. When the light rays incident on the converging part 11 of the optical path adjusting unit 13 are transmitted out of the light scattering part 13 of the optical path adjusting unit, they are adjusted as the light rays with substantially the same transmitting direction; moreover, the transmitting directions of the light rays may be unparallel to the incident directions of the light rays, and the substantially identical transmitting direction of the light rays may be the "front-facing" direction of the human eyes.

Figure 2:
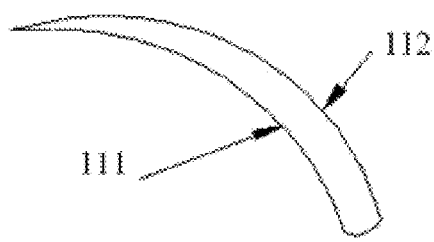
FIG. 2 is a schematic view of the structure of the light converging part in FIG. 1.
Figure 3:
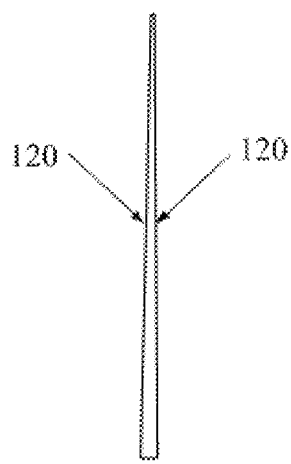
FIG. 3 is a schematic view of the structure of the reflective part in FIG. 1.

As shown in FIG. 1, the light converging part 11 comprises two light converging sheets 110 disposed symmetrically (the two light converging sheets 110 are symmetrical with respect to the symmetric plane of the light converging part 11), wherein the light converging sheets 110 use the arc structure shown in FIG. 2, which comprises a light converging inner arc surface 111 relatively far away from the hollow space and a light converging outer arc surface 112 relatively close to the hollow space, and the radian of the light converging outer arc surface 112 is greater than that of the light converging inner arc surface 111. The light scattering part 13 uses the symmetric arc structure shown in FIG. 4, which comprises a light scattering inner arc surface 131 and a light scattering outer arc surface 132, both of which are symmetric with respect to the symmetric plane of the light scattering part 13. Moreover, the light scattering inner arc surface 131 is relatively close to the hollow space, while the light scattering outer arc surface 132 is relatively far away from the hollow space. The light converging part 11 and the light scattering part 13 form a symmetric hollow space. The reflective part 12 shown in FIG. 3 is disposed in the symmetric plane of the symmetric hollow space, and is connected to the middle of the light converging part 11 in the symmetric plane of the light converging part 11 and the middle of the light scattering part 13 in the symmetric plane of the light scattering part 13 respectively, so as to divide the hollow space into two sub-hollow spaces with the same shape and size. The light rays reflected to the light scattering part 13 transmit in the direction approximately parallel to the direction of the symmetric plane of the hollow space.

Specifically, the light converging part 11 comprises two arc light converging sheets 110 with the same shape and size, which are disposed in the form of mirror symmetry, wherein the two light converging sheets 110 are connected to each other at one end, and the other ends are connected to the two ends of the light scattering part 13 respectively. the reflective part 12 is disposed in the mirror symmetric plane of the two light converging sheets 110, one end of which is connected to the ends of the two light converging sheets 110 connected to each other, and the other end is connected to the middle of the light scattering part 13, which is in the symmetric plane of the light scattering part 13, to divide the hollow space into two sub-hollow spaces with the same shape and size. Wherein the mirror symmetric plane of the two light converging sheets 110 (i.e., the symmetric plane of the light converging part 11), the symmetric plane of the light scattering part 13 and the symmetric plane of the hollow space are coincident.

Each light converging sheet 110 uses convex lens structure. According to the different application scenarios of the optical path adjusting unit, e.g., according to the difference of the bended degrees of the bended emitting part emitting the incident light rays to the light converging part 11, the light converging sheet 110 may be a irregular convex lens structure with different refractive indexes, to make the light rays incident from the side direction converge toward the front-facing direction as much as possible. The light converging sheet 110 shown in FIG. 2 has an arc structure, the radian of light converging inner arc surface 111 of which is preferably consistent with the bended radian of the bended light emitting part, so that curvature radius of the light converging inner arc surface 111 may gradually increase with the increase of the bended degree of the bended light emitting part of the light rays incident to the light converging sheet 110, such that the optical path adjusting unit may better combine with the bended light emitting part, to ensure more light rays incident from the side direction will be converged to the internal of the optical path adjusting unit more uniformly.

As shown in FIG. 3, the reflective part 12 is a symmetric wedge-shaped structure, and the larger end of the symmetric wedge-shaped structure is connected to the ends of the two light converging sheets 110 connected to each other, i.e., to the middle of the light converging part 11, and the smaller end is connected to the middle of the light scattering part 13, which is in the symmetric plane of the light scattering part. That is, the two side surfaces of the reflective part 12 facing the two light converging sheets 110 respectively, are symmetric with respect to its symmetric plane, and the symmetric plane of the reflective part 12 coincides with the mirror symmetric plane of the two light converging sheets 110, the symmetric plane of the hollow space and the symmetric plane of the light scattering part 13.

In one example, the symmetric wedge-shaped structure used by the reflective part 12 has a small angle, which is preferably in the range of 3°-7°, further preferably 5°. If the angle of the symmetric wedge-shaped structure is 5°, the strength of the wedge-shaped structure can be guaranteed, and the manufacture may be easier. The light rays converged by the light converging part 11 can be reflected by the two side surfaces of the reflective part 12 through using the reflective part 12 with the wedge-shaped structure with a small angle, since the bigger end of the wedge-shaped structure is connected to the middle of the light converging part 11, which is in the symmetric plane of the light converging part 11, while the smaller end is connected to the middle of the light scattering part 13, which is in the symmetric plane of the light scattering part 13, so that the light rays converged by the light converging part 11 will transmit to the light scattering part 13 as much as possible, and the travel path of the light rays incident from the side direction will be changed to the maximum extent. Here it should be understood that according to the light source, the top end of the reflective part 12 connected to the middle of the light scattering part 13 may be a sharp shape, and the reflective part 12 may also be a isosceles trapezoid with an arc upper bottom surface with the sharp top cut, furthermore, according to the range of the radian of the light scattering part 13, preferably, the arc upper bottom surface of the isosceles trapezoid matches the light scattering inner arc 131 of the light scattering part 13.

Moreover, the two side surfaces of the wedge-shaped structure used by the reflective part 12 facing the two light converging sheets 110 are disposed with reflective film 120, which may use any coating films that have reflective function, which are not limited to here. Coating film 120 is disposed on both side surfaces of the reflective part 12, which may reduce the loss of the optical energy, so that the light rays converged by the light converging part 11 transmit in air 30 of the hollow space to the two side surfaces of the reflective part 12, and are reflected by the two side surfaces of the reflective part 12, so that the travel paths of the incident light rays from the side surface are changed to the maximum extend. Since there is a certain angle between each of the two side surfaces of the reflective part 12 coated with the reflective film 120 and the symmetric planes of the hollow space, the converged light rays will be reflected toward the front-facing direction as much as possible, instead of being reflected toward the direction opposite to the side.

Figure 4:
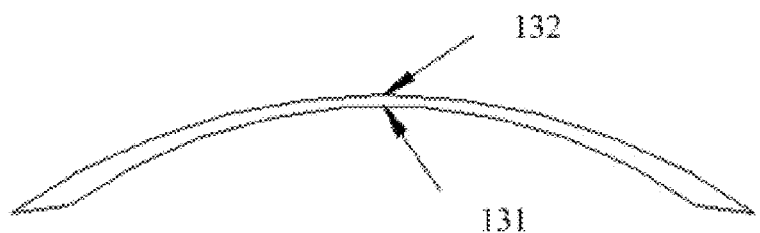
FIG. 4 is a schematic view of the structure of the light scattering part in FIG. 1.

As shown in FIG. 4, the light scattering part 13 may be a symmetric concave lens structure. Since the light scattering part 13 is a regular concave lens structure, the light rays reflected by the reflective part 12 may transmit in the front-facing direction after being scattered by the light scattering part 13. Since the symmetric plane of the light scattering part 13 coincides with the symmetric plane of the hollow space of the optical path adjusting unit, it may ensure that the light rays propagating within the hollow space may have the same optical performance in the front-facing direction, so that the light rays transmitted out of the light scattering part 13 may evenly transmit in the front-facing direction.

In this embodiment, the light converging part 11, the reflective part 12 and the light scattering part 13 may be molded integrally, e.g., the above light converging part 11, the reflective part 12 and the light scattering part 13 may be printed in a 3D printing manner. Optionally, the light converging part 11, the light scattering part 13 and the reflective part 12 are formed respectively, and then the light converging part 11, the light scattering part 13 and the reflective part 12 are assembled together. Optionally, the light converging part 11 and the light scattering part 13 are formed integrally, and the reflective part 12 is formed independently, then the independently formed reflective part 12 and the integrally formed light converging part 11, and light scattering part 13 are assembled together. When the reflective part 12 is independently formed, the reflective part 12 is manufactured independently, the two side surfaces of which are coated with reflective film 120 to enhance the reflective effect, and then the reflective part 12 is embedded into the hollow space formed by the light converging part 11 and the light scattering part 13, so that the two side surfaces of the reflective part 12 coated with the reflective film 120 face the two light converging sheet 110 respectively, and the hollow space is divided into two sub-hollow spaces with the same shape and size by the reflective part 12.

In this embodiment, the light converging part 11, the reflective part 12 and the light scattering part 13 are all manufactured by using colorless and transparent materials. For example, the light converging part 11, the light reflective part 12 and the light scattering part 13 may be formed by glass materials (e.g., BK7, etc.) or resin materials (e.g., PMMA (polymethyl methacrylate) etc.). It should be understood that, in this embodiment, the materials of the light converging part 11, the reflective part 12 and the light scattering part 13 are not limited, as long as it is guaranteed that the optical adjusting unit is colorless and transparent.

Figure 5:
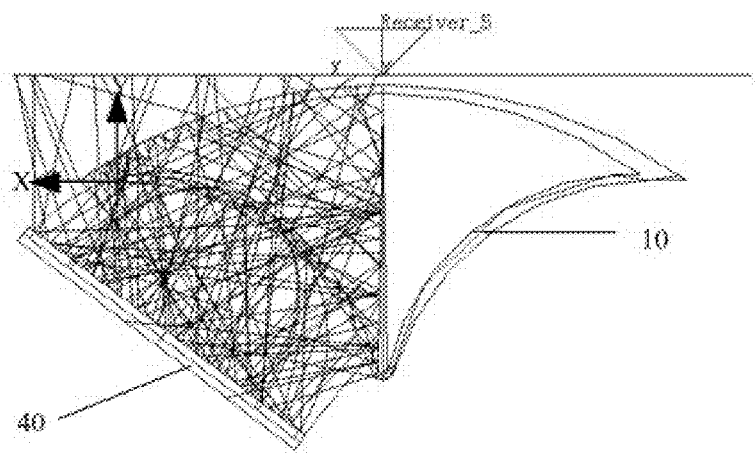
FIG. 5 is an optical simulation model schematic view of the optical path adjusting unit in FIG. 1.

FIG. 5 shows an optical simulation model schematic view of the optical path adjusting unit. As shown in FIG. 5, the plane light source 40 is disposed slantly with respect to the optical path adjusting unit 10, and the light emitting plane of the plane light source 40 faces the light converging part 11 of the optical path adjusting unit 10. Receiver_5 is the middle position where the simulation light will be converged. The light rays emitted from the plane light source 40 enter into the light converging part 11, are converged by the light converging part 11 and reflected by the light reflecting part 12, and then are transmitted out of the light scattering part 13 in the direction approximately parallel to the symmetric plane of the hollow space (e.g., direction Y in FIG. 5), so as to realize the propagation of the light rays without leakage, and thus avoid the loss of optical energy.

In this embodiment, it should be understood that regularly shaped light converging part, light reflective part and the light scattering part are used in the optical adjusting unit, but the optical path adjusting unit is not limited to this, as long as the light converging part and the light scattering part may form a hollow space, and the reflective part disposed in the hollow space will reflect the light rays converged by the light converging part to the light scattering part. The specific shape of the light converging sheet forming the light converging part will be adjusted according to the shape of the bended light emitting part emitting the incident light rays to be adjusted; the shape of the reflective part for reflecting the light rays may be a wedge-shaped structure or other shapes including curving shape; the shape of the light scattering part for scattering the light rays incident thereon and transmitting the light rays out in a similar directions may be adjusted as required, and the present invention does not limit to this.

Through the optical path adjusting unit in this embodiment, by arranging the structures of the light converging part, the light reflective part and the light scattering part with symmetric structure and making the symmetric plane of the light converging part, the symmetric plane of the light scattering part, the symmetric plane of the reflective part coincide with the symmetric planes of the hollow space formed by the light converging part and the light scattering part, the light rays incident from different directions can be adjusted to transmit in approximately the same direction, and the structure of the optical path adjusting unit is simple and easy to be manufactured.

Embodiment 2:

This embodiment provides a display device, which comprises the optical path adjusting unit in embodiment 1.

Figure 6:
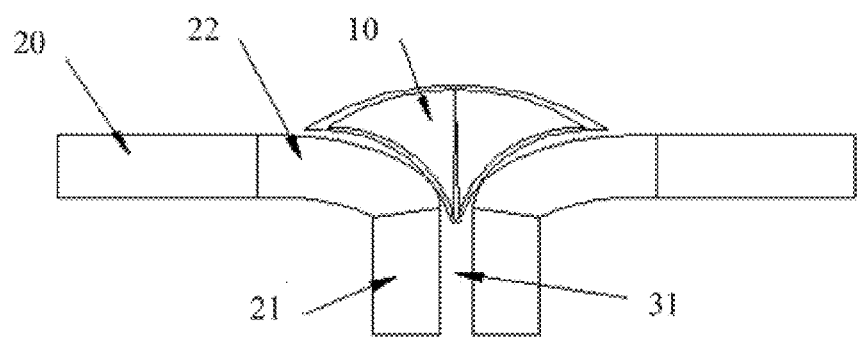
FIG. 6 is a schematic view of the structure of the display device in embodiment 2 of the present invention.

As shown in FIG. 6, the display device comprises at least two display screens 20 which can be spliced together, and there is a splicing gap 31 between the adjacent display screens 20 to be spliced, and the optical path adjusting unit 10 provided by embodiment 1 is disposed within the splicing gap 31. The outgoing light rays adjusted by the optical path adjusting unit 10 transmit in the front-facing direction, and here the term "front-facing direction" refers to the normal direction of the large-sized entire display screen spliced by a plurality of display screens.

It can be understood that the display screen 20 comprises a substrate; a black matrix (BM) and a light emitting unit (not shown in FIG. 6), which are stacked sequentially on the substrate. In this embodiment, the edge part of the display screen 20 is bended inwards (i.e., the direction opposite to the direction where the light rays emitted by the light emitting unit out of the display screen 20) to form a bended part, and a splicing gap 31 is formed between the bended parts of the adjacent display screens 20 to be spliced. The optical path adjusting unit 10 is disposed within the splicing gap 31, and the lengths of the light converging part 11, the reflective part 12 and the light scattering part 13 are the same as the length of the splicing gap 31 of the display screen 20.

The bended part of the display screen 20 comprises a plane part 21 and a curved surface part 22, and the radian of the light converging inner arc 111 of the light converging sheet 110, which is far away from the hollow space of the light converging part 11, is consistent with the radian of the surface part 22, and the plane part 21 may be vertically disposed with the middle part of the display screen 20. Since it is difficult for the light rays emitted from the light emitting unit in the plane part 21 to reach the optical adjusting unit 10, the plane part 21 may either include the black matrix and the light emitting unit, or merely includes the black matrix and does not include the light emitting unit, so as to save cost. The curved surface part 22 comprises a black matrix (BM in short) and a light emitting unit, and the light rays emitted by the light emitting unit of the curved surface part 22 may be incident upon the light converging part 11 in different directions, and then are converged by the light converging part 11 and reflected by the reflective part 12 in sequence, finally, transmit out of the light scattering part 13 in a direction approximately parallel to the direction of the plane part 21. In this description, the part including the light emitting unit in the bended part is referred to as the bended light emitting part. It can be understood that the bended light emitting part may merely include the curved surface part 22, or include the curved surface part 22 and part of or all of the plane part 21.

Wherein, the light emitting unit in the display screen may be an organic light emission display (OLED). As shown in FIG. 6, the BM parts of the two flexible AMOLED display screens are bended downwards (i.e., the direction opposite to the direction that the light rays emitted by the light emitting unit emerge the display screen) and then are spliced, leaving a splicing gap 31 for placing the optical path adjusting unit 10. Wherein, according to the degree of the flexible AMOLED display screen being bended, the light converging part 11 may be irregular concave structures with different refractive indexes, and its light converging inner arc surface 111 is preferably be consistent with the bended radian of the bended light emitting part, so that the optical path adjusting unit 10 is better combined with the flexible AMOLED display screens to be spliced, to make the light rays originally transmitted from the side direction be converged in the front-facing direction as much as possible. The two adjacent AMOLED display screens to be spliced are symmetric with respect to the symmetric plane of the light scattering part 13, so that the light rays emitted by the light emitting unit of the curve plane 22 are transmitted out of the light scattering part 13 evenly in the front-viewing direction after being reflected by the reflective part 12, to ensure that the bended light emitting part of the AMOLED display screen to be spliced has the same optical performance in the front-facing direction, to achieve the seamless and frameless display of the spliced flexible display screens.

Figure 7:
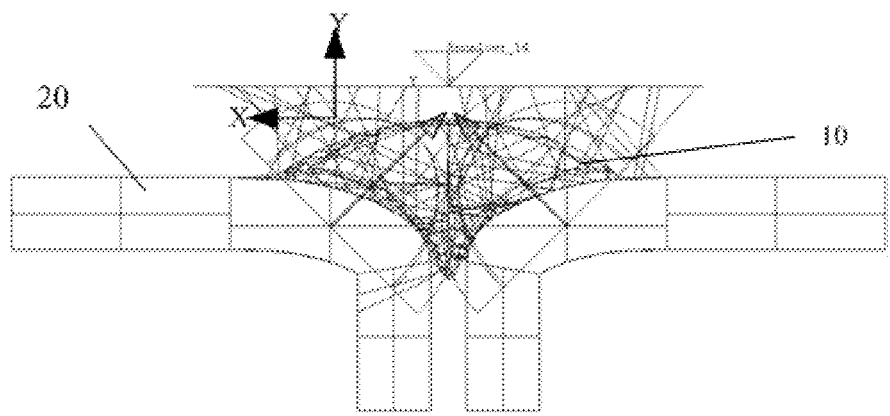
FIG. 7 is an optical simulation module schematic view of the display device in FIG. 6.

Based on the above structure, the optical simulation model of the display device is established, as shown in FIG. 7, wherein the light sources therein mainly comprise the light emitting unit in the curved surface part 22 of the display screen 20; Receiver_14 is the central position where the simulation light converges. As can be seen from FIG. 7, the light rays emitted from the light emitting unit of the curved surface part 22 enter into the light converging part 11 of the optical path adjusting unit 10 from different directions, and after the light rays converged by the light converging part 11 are reflected in the optical path adjusting unit 10, they are transmitted out of the light scattering part 13 of the optical path adjusting unit 10 (e.g., in direction Y in FIG. 7), having substantially the same light transmitting directions as the non-bended part of the display screen 20, so as to achieve the even light emission of the bended light emitting part in the front-viewing direction.

Figure 8:
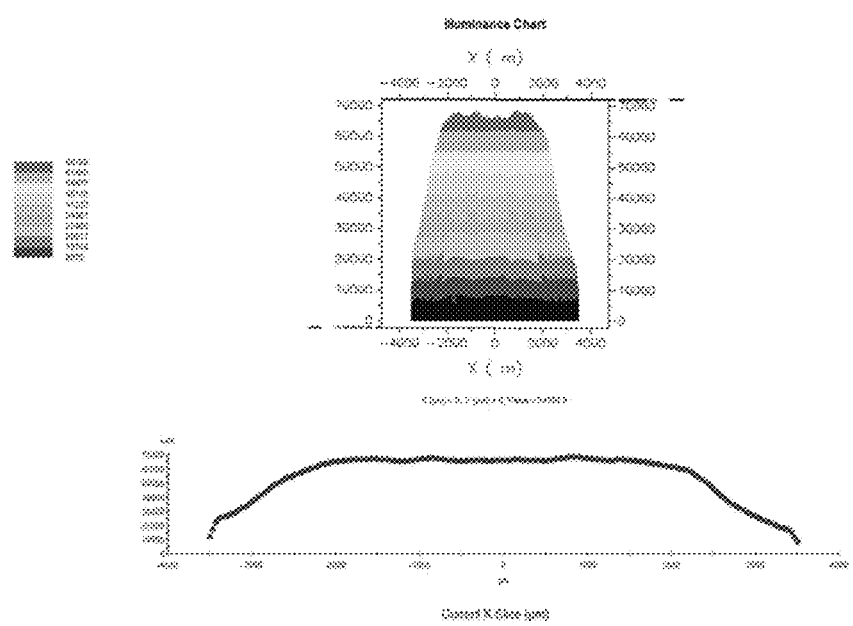
FIG. 8 is an illumination diagram of the two adjacent display screens in the display state in FIG. 7.
Figure 9:
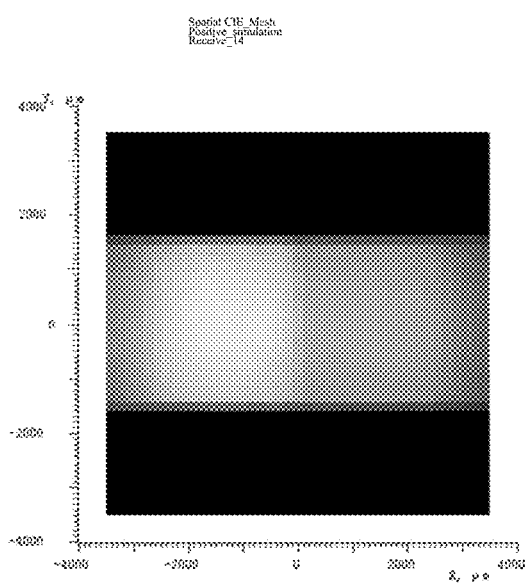
FIG. 9 is a spatial chromaticity grid diagram of the two adjacent display screens in the display state.

Further, in the display state of the display device shown in FIG. 7, perform an illuminance analysis and a space chrominance analysis to the adjacent spliced display screen 20, to get the illuminance chart shown in FIG. 8 and the spatial CIE mesh shown in FIG. 9. In FIG. 8, there is no the phenomena that two sides are high and the middle is low (i.e., corresponding to that the two sides of the screen are bright while the middle is black) in the lateral direction, indicating that the illuminance of bended light emitting part is substantially consistent with that of the non-bended light emitting part; it can be seen that when the optical path adjusting unit 10 is used to adjust the light rays emitted by the bended light emitting part of the display screen 20, the illuminance of the light rays emitted by the bended light emitting part and the non-bended light emitting part are uniform, the displayed images thus are continuous. In FIG. 9, the bended light emitting part and the non-bended light emitting part do not have the color-blending phenomenon (there is no color-blending interface of the left yellow Y and right green G), realizing the seamless display of the bended light emitting part of the adjacent two flexible display screens to be spliced in the front-viewing direction.

The display device provided by this embodiment, by bending and splicing the edge parts of two flexible AMO-LED display screens downwards, and disposing the optical path adjusting unit in the gap formed by splicing, the original bent light emitting part may emit light in, e.g., the front-viewing direction, ensuring that the bent display part can be better displayed, therefore, the frameless and seamless display of the flexible display screen formed by the splicing manner can be better achieved.

The display device is mainly suitable for the outdoor or indoor display scenarios with requirement for large display, and of course they may be liquid crystal panels, electronic papers, OLED panels, cell phones, tablet computers, televisions, displays, notebook computers, digital photo frames, navigators, and any products or parts that have the display function.

According to the display device in this embodiment, by using the optical path adjusting unit in embodiment 1, a frameless and big-sized flexible display screen structure formed by way of splicing can be realized, and the display panel of the display device has good splicing effect, continuous displayed images and better visual effect.

It may be understood that the above embodiments are merely exemplary embodiments to explain the principles of the present invention, but the scope of the present invention is not limited to this. To those skilled in the art, various variations and improvements may be made without departing from the spirits and essences of the present invention, and these variations and improvements are also viewed as the protection scope of the present invention.

What is claimed is:

1. An optical path adjusting unit for adjusting light rays incident from different directions to transmit in approximately the same direction, comprising a light converging part, a reflective part and a light scattering part; the light converging part and the light scattering part forming a hollow space, the reflective part disposed within the hollow space and connected to the middle of the light converging part and the middle part of the light scattering part respectively to divide the hollow space into two parts;
   wherein the light converging part is used to converge light rays incident thereon from different directions, the reflective part is used to reflect the light rays converged by the light converging part onto the light scattering part, and the light scattering part is used to transmit the light rays reflected thereon by the reflective part out in approximately the same direction.

2. The optical path adjusting unit of claim 1, wherein the light converging part comprises two arc structures disposed symmetrically, the light scattering part is a symmetric arc structure, the light converging part and the light scattering part form a symmetric hallow space, the reflective part is arranged in a symmetric plane of the symmetric hollow space, and the light rays reflected onto the light scattering part are transmitted out in a direction approximately parallel to the direction of the symmetric plane of the hollow space.

3. The optical path adjusting unit of claim 2, wherein the light converging part comprises two arc light converging sheets with the same shape and size and disposed in the form of mirror symmetry; wherein the two light converging sheets are connected to each other at one end, and the other ends are connected to the two ends of the light scattering part respectively; the reflective part is disposed in the mirror symmetric plane of the two light converging sheets, one end of which is connected to the ends of the two light converging sheets connected to each other, and the other end is connected to the middle of the light scattering part, which is located in the symmetric plane of the light scattering part.

4. The optical path adjusting unit of claim 3, wherein each of the light converging sheets is a convex lens structure, a radian of the arc surface of the light converging sheet close to the hollow space is greater than that of the arc surface far away from the hollow space.

5. The optical path adjusting unit of claim 3, wherein the light scattering part is a concave lens structure.

6. The optical path adjusting unit of claim 3, wherein the reflective part is a symmetric wedge-shaped structure, and the larger end of the symmetric wedge-shaped structure is connected to the ends of the two light converging sheets connected to each other, the smaller end is connected to the middle of the light scattering part which is located in the symmetric plane of the light scattering part, and
   the two side surfaces of the symmetric wedge-shaped structure facing the two light converging sheets are disposed with reflective films respectively.

7. The optical path adjusting unit of claim 6, wherein the angle of the symmetric wedge-shaped structure is in the range of 3° to 7°.

8. The optical path adjusting unit of claim 1, wherein the light converging part, the reflective part and the light scattering part are formed integrally;
   or, the light converging part, the light scattering part and the reflective part are formed respectively, and then are assembled together;
   or, the light converging part and the light scattering part are formed integrally, and the reflective part is formed independently, and then the reflective part formed independently and the light converging part and the light scattering part formed integrally are assembled together.

9. The optical path adjusting unit of claim 1, wherein the light converging part, the reflective part and the light scattering part are formed by using colorless and transparent materials.

10. The optical path adjusting unit of claim 9, wherein the light converging part, the reflective part and the light scattering part are formed by using glass materials or resin materials.

11. A display device, comprising at least two display screens which can be spliced together, there being a splicing gap between the adjacent display screens, wherein the optical path adjusting unit of claim 1 is disposed in the splicing gap.

12. The display device of claim 11, wherein the edge part of the at least two display screen bends inwards to form a bended part, and the splicing gap is formed between the bended parts of the adjacent display screens; wherein the optical path adjusting unit is disposed in the splicing gap, and the lengths of the light converging part, the reflective part, and the slight scattering part are the same as that of the splicing gap of the display screens.

13. The display device of claim 12, wherein the bended part of the display screen comprises a plane part and a curve surface part, wherein a radian of the curve surface part is consistent with a radian of the arc surface of the light converging part, in the light converging part, far away from the hollow space; wherein the curve surface part comprises a black matrix and a light emitting unit, and the light rays emitted from the light emitting unit enter into the light converging part in different directions and are transmitted out of the light scattering part in a direction approximately parallel to the direction of the plane part.

14. The display device of claim 11, wherein the light converging part comprises two arc structures disposed symmetrically, the light scattering part is a symmetric arc structure, the light converging part and the light scattering part form a symmetric hallow space, the reflective part is arranged in a symmetric plane of the symmetric hollow space, and the light rays reflected onto the light scattering part are transmitted out in a direction approximately parallel to the direction of the symmetric plane of the hollow space.

15. The display device of claim 14, wherein the light converging part comprises two arc light converging sheets with the same shape and size and disposed in the form of mirror symmetry; wherein the two light converging sheets are connected to each other at one end, and the other ends are connected to the two ends of the light scattering part respectively; the reflective part is disposed in the mirror symmetric plane of the two light converging sheets, one end of which is connected to the ends of the two light converging sheets connected to each other, and the other end is connected to the middle of the light scattering part, which is located in the symmetric plane of the light scattering part.

16. The display device of claim 15, wherein each of the light converging sheets is a convex lens structure, a radian of the arc surface of the light converging sheet close to the hollow space is greater than that of the arc surface far away from the hollow space.

17. The display device of claim 15, wherein the light scattering part is a concave lens structure.

18. The display device of claim 15, wherein the reflective part is a symmetric wedge-shaped structure, and the larger end of the symmetric wedge-shaped structure is connected to the ends of the two light converging sheets connected to each other, the smaller end is connected to the middle of the light scattering part which is located in the symmetric plane of the light scattering part, and the two side surfaces of the symmetric wedge-shaped structure facing the two light converging sheets are disposed with reflective films respectively.

19. The display device of claim 18, wherein the angle of the symmetric wedge-shaped structure is in the range of 3° to 7°.

20. The display device of claim 11, wherein the light converging part, the reflective part and the light scattering part are formed integrally;

or, the light converging part, the light scattering part and the reflective part are formed respectively, and then are assembled together;

or, the light converging part and the light scattering part are formed integrally, and the reflective part is formed independently, and then the reflective part formed independently and the light converging part and the light scattering part formed integrally are assembled together.

* * * * *